United States Patent
Horch

(10) Patent No.: US 6,828,202 B1
(45) Date of Patent: Dec. 7, 2004

(54) SEMICONDUCTOR REGION SELF-ALIGNED WITH ION IMPLANT SHADOWING

(75) Inventor: Andrew Horch, Sunnyvale, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/400,943

(22) Filed: Mar. 27, 2003

Related U.S. Application Data

(63) Continuation of application No. 10/262,770, filed on Oct. 1, 2002.
(60) Provisional application No. 60/437,547, filed on Dec. 31, 2002.

(51) Int. Cl.[7] .............................................. H01L 21/336
(52) U.S. Cl. ......................... 438/302; 438/525; 438/531
(58) Field of Search ................................. 438/302, 525, 438/531

(56) References Cited

U.S. PATENT DOCUMENTS

| | | | |
|---|---|---|---|
| 3,873,371 A | * 3/1975 | Wolf ........................... | 438/144 |
| 3,914,857 A | * 10/1975 | Goser et al. ................. | 438/144 |
| 4,698,899 A | * 10/1987 | Kakihana ..................... | 438/179 |
| 4,700,454 A | 10/1987 | Baerg et al. | |
| 4,810,664 A | 3/1989 | Kamins et al. | |
| 5,208,472 A | 5/1993 | Su et al. | |

(List continued on next page.)

FOREIGN PATENT DOCUMENTS

JP 07-58052 * 3/1995

OTHER PUBLICATIONS

Mark Rodder and D. Yeakley, *Raised Source/Drain MOSFET with Dual Sidewall Spacers*, IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

N. Lindert, Y.–K. Choi, L. Chang, E. Anderson, W.–C. Lee, T.–J. King, J. Bokor, and C. Hu. *Quasi–Planar FinFETs with Selectively Grown Germanium Raised Source/Drain*, 2001 IEEE International SOI Conference, Oct. 1, 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

(List continued on next page.)

*Primary Examiner*—George Fourson
*Assistant Examiner*—Fernando L. Toledo

(57) ABSTRACT

A semiconductor device includes doped regions of a substrate spaced at selected distances from features at an upper surface of the substrate. According to an example embodiment of the present invention, the doped regions are implanted and spaced apart from the features with the height of the features and the angle of an implant used for implanting the doped regions setting the space between the doped regions and the features. In one implementation, the height of the features is varied (e.g., with the features being defined using different steps, such as photolithography) to set the spacing of different doped regions. In another implementation, the angle of the implant is varied to set the spacing for different doped regions. In still another implementation, both the height of the features and angle of the implant are varied to set the spacing for different doped regions. With these approaches, alignment and spacing of doped features is achieved using a process that is predictable and controllable, which can reduce variations typically present in connection with other commonly-used alignment techniques, such as photolithography.

4 Claims, 5 Drawing Sheets

U.S. PATENT DOCUMENTS

| | | | |
|---|---|---|---|
| 5,355,006 A | * 10/1994 | Iguchi | 257/296 |
| 5,399,507 A | 3/1995 | Sun | |
| 5,436,482 A | 7/1995 | Ogoh | |
| 5,472,887 A | 12/1995 | Hutter et al. | |
| 5,547,883 A | * 8/1996 | Kim | 438/158 |
| 5,612,246 A | 3/1997 | Ahn | |
| 5,705,439 A | 1/1998 | Chang | |
| 5,759,897 A | 6/1998 | Kadosh et al. | |
| 5,770,502 A | * 6/1998 | Lee | 438/264 |
| 5,894,152 A | 4/1999 | Jaso et al. | |
| 5,895,955 A | 4/1999 | Gardner et al. | |
| 5,905,293 A | 5/1999 | Jeng et al. | |
| 5,920,103 A | 7/1999 | Fulford et al. | |
| 5,930,629 A | * 7/1999 | Fukumoto | 438/261 |
| 5,956,597 A | 9/1999 | Furukawa et al. | |
| 5,965,464 A | 10/1999 | Tsai et al. | |
| 6,008,094 A | * 12/1999 | Krivokapic et al. | 438/286 |
| 6,020,242 A | 2/2000 | Tsai et al. | |
| 6,104,045 A | 8/2000 | Forbes et al. | |
| 6,107,125 A | 8/2000 | Jaso et al. | |
| 6,124,610 A | 9/2000 | Cheek et al. | |
| 6,128,216 A | 10/2000 | Noble, Jr. et al. | |
| 6,168,999 B1 | 1/2001 | Ziang et al. | |
| 6,191,462 B1 | 2/2001 | Chen-Hua | |
| 6,214,694 B1 | 4/2001 | Leobandung et al. | |
| 6,225,165 B1 | 5/2001 | Noble, Jr. et al. | |
| 6,229,161 B1 | * 5/2001 | Nemati et al. | 257/133 |
| 6,229,187 B1 | 5/2001 | Ju | |
| 6,255,145 B1 | 7/2001 | Ajmera et al. | |
| 6,255,174 B1 | * 7/2001 | Yu | 438/286 |
| 6,281,558 B1 | * 8/2001 | Sayama et al. | 257/391 |
| 6,372,587 B1 | * 4/2002 | Cheek et al. | 438/302 |
| 6,426,262 B1 | * 7/2002 | Fuselier et al. | 438/276 |
| 6,479,868 B1 | * 11/2002 | An et al. | 257/348 |
| 6,566,204 B1 | * 5/2003 | Wang et al. | 438/286 |
| 6,617,218 B2 | * 9/2003 | Kawashima | 438/301 |

OTHER PUBLICATIONS

Hsiang–Jen Huang, Kun–Ming Chen. Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain*, IEEE Transactions on Electron Devices, vol. 48, No. 8, Aug. 2001.

K. DeMeyer, S. Kubicek and H. van Meer, *Raised Source/Drains with Disposable Spacers for sub 100 nm CMOS technologies*, Extended Abstracts of International Workshop on Junction Technology 2001.

Stanley Wolf PhD. and Richard N. Tauber PhD., *Silicon Processing for the VLSI Era,* vol. 1, pp. 280–330, 1986.

* cited by examiner

SEMICONDUCTOR REGION SELF-ALIGNED WITH ION IMPLANT SHADOWING

RELATED PATENT DOCUMENTS

This patent document claims the benefit of U.S. Provisional Patent Application Ser. No. 60/437,547, entitled "Gated-Thyristor Approach Having Angle-Implanted Base Region," filed Dec. 31, 2002, and is a continuation of U.S. patent application Ser. No. 10/262,770, entitle "Self-Aligned Thin Capacitively-Coupled Thyristor Structure," filed Oct. 1, 2002.

FIELD OF THE INVENTION

The present invention is directed to semiconductor devices and, more specifically, to semiconductor devices such as memory and switching circuits including thyristors.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices, such as SRAM, DRAM, thin capacitively-coupled thyristor memory circuits, NMOSFETS and PMOSFETS, concerns the ability to accurately and efficiently define features within the devices. There are many types of such features including, for example, source/drain regions or gate stacks of transistors, bases or emitter regions or thyristors, and other device materials (e.g., resists, dielectrics and (semi)conductive layers) as used in processing semiconductor devices. One approach to feature definition includes patterning a photoresist mask over a substrate, directing ions at the substrate and using the mask to prevent portions of the substrate from being implanted with the ions. This type of feature definition often involves use of spacer material formed on a feature's sidewalls to mask portions of the substrate below the spacers. However, photoresist patterning is sometimes non-uniform and difficult to control, and can result in asymmetric features due to misalignment and width variations of the photoresist. Such asymmetric results may include, for example, short circuits, open circuits and other circuit characteristics that affect the operation of the device in which the defined features are to be used.

Using spacers as symmetric structures around topological features, such as a gate stack and/or resist, would typically add, complexity to the process if device formation requires the spacer to be removed later in the process. Where such spacers are used with devices requiring finely-controlled asymmetric doping, a portion of the spacer might need to be removed to achieve the asymmetric doping; this removal step adds process complexity. In other applications, the horizontal dimension of a feature-surrounding pacer is used to shadow implant a doped region beyond the horizontal dimension of the spacer; however, this horizontal dimension is typically limited by the feature's height dimension. To increase the horizontal spacer dimension, a combination of spacer and implant shadowing can be used. For applications that require doping various regions with different distances from respective features, using multiple spacers in an attempt to accomplish this result can lead to an unduly complex process. For example, such a process would involve multiple process steps of shadowed ion implants.

These and other considerations have presented challenges to implement a variety of circuits in bulk substrate applications, and in particular to high-density applications.

SUMMARY

The present invention is directed to overcoming the above-mentioned challenges and others related to the types of devices and applications discussed above and in others. The present invention is exemplified in a number of implementations and applications, some of which are summarized below.

According to an example embodiment of the present invention, a semiconductor device is manufactured using ion implant shadowing to self-align features or structures therein. More specifically, doped substrate portions of the semiconductor device are formed using an angled ion implant and features defined on a surface of the substrate, with the surface features masking a portion of the substrate. The height of the surface features and the angle of the ion implant are selected and used to define the extent that substrate portions adjacent to the surface features are masked, and thus determine which portions of the substrate are implanted. With this approach, variation in the width of doped regions in the substrate is set as a function of parameters including the height of features used to mask the substrate and the ion implant angle.

In another example embodiment of the present invention, a memory cell includes a thyristor having a base region thereof in a substrate and aligned to a feature on an upper surface of the substrate. An angled implant is used, in connection with the feature, to space the base region at a selected distance from the feature (e.g., with the space between the feature and the base region being increased with smaller implant angles).

In another example embodiment of the present invention, two or more ion implants are carried out from different directions over a substrate for implanting regions in the substrate spaced at different distances from a surface feature on the substrate. A first ion implant is carried out from a first direction (e.g., left-to-right) and at a first angle, resulting in a portion of the substrate being doped on a first side of the surface feature. A second ion implant is then carried out from a second direction that is different than the first direction (e.g., right-to-left) and at a second angle, resulting in a portion of the substrate being doped on a second side of the surface feature that is opposite the first side. In one implementation, the first and second ion implant angles are the same, relative to the substrate, and in another implementation, the first and second ion implant angles are different.

In another example embodiment of the present invention, two or more features are defined on an upper surface of a substrate and at different heights selected for subsequent ion-implant alignment. An angled ion implant is carried out, with the two or more features being used to mask a portion of the substrate. The different heights of the two or more features results in implanted regions adjacent to each of the two or more features having different spacing from the two or more features. For instance, an implanted region adjacent to a high feature is spaced at a greater distance from the high feature than the spacing of an implanted region adjacent to a relatively lower feature.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
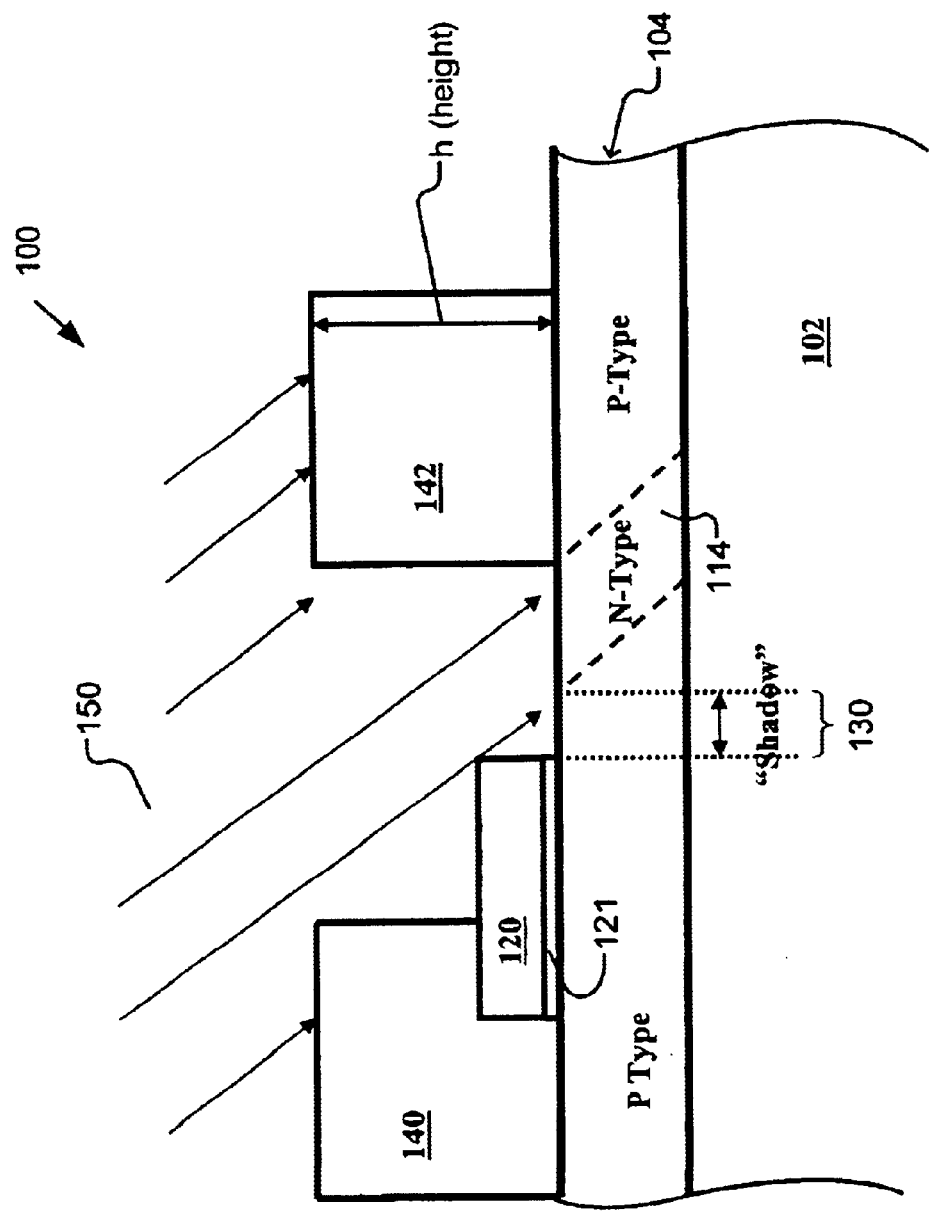
FIG. 1 is a semiconductor device undergoing implantation using ion implant shadowing, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for semiconductor applications involving doped substrate regions below an upper surface of the substrate. For instance, memory and current-switching applications involving CMOS devices or thyristors may benefit from the formation of doped regions spaced from features on a substrate surface. While the present invention is not necessarily limited to such applications, various aspects of the invention may be appreciated through a discussion of various examples using this context.

According to an example embodiment of the present invention, a portion of a semiconductor substrate having features disposed on a surface thereof is doped using an angled ion implant, with the doped portion being aligned to and selectively offset from the features on the surface. The amount of offset is determined by the angle of the ion implant and the height of the topological feature, with the feature masking a shadow portion of the substrate immediately adjacent to the feature. In one specific implementation, the length (L) of the offset (i.e., distance between the closest doped portion of the substrate and the feature) is related to the height (H) of the feature and the implant angle (A) by the following equation: $L = H * \tan(A)$. With this approach, doped features of the substrate are offset-aligned to features without necessarily using photolithography, spacers or other masking techniques. This approach is useful, for example, in processes where it is desirable to reduce the number of masking steps, with the features on the substrate being used, for example, instead of a mask. This approach is also useful, for example, in applications where it is desirable to electrically isolate doped substrate regions from feature disposed on a surface of the substrate.

According to another example embodiment of the present invention, at least two regions of a semiconductor substrate are doped using an angled implant approach similar to that discussed in the above paragraph. In this implementation, features (or circuit structures such as gates, metal layer portions or other commonly-used structures) are disposed on a surface of the substrate with a patterned mask disposed therebetween. An angled ion implant is used to dope a first region in the substrate, with a first feature masking a first shadow portion of the substrate immediately adjacent to the first feature. Similarly, a second angled ion implant is used to dope a second region in the substrate, with a second feature masking a second shadow portion of the substrate immediately adjacent to the second feature.

During both ion implants, the patterned mask prevents ions from implanting a portion of the substrate between the patterned mask and the opposite feature. For example, this prevents the substrate between the patterned mask and the second feature from being doped during the first implant. The height and width of the patterned mask affects the extent to which the ion implant is blocked, and as such are selected to control the arrangement of the portions of the substrate being implanted. This approach is particularly useful, for example, for implanting the substrate with differently-sized shadow portions adjacent to different topological features.

FIG. 1 shows a semiconductor device 100 undergoing doping with an angled ion implant, according to another example embodiment of the present invention. Dielectric material 121 is formed on a P-type active region 104 over a semiconductor substrate 102, and a word line 120 is formed on the dielectric material 121. A layer of photoresist material is deposited and exposed over the P-type active region 104 and the topological feature, in this instance gate 120, leaving resist portions 140 and 142 behind. Ions (represented by arrows 150) are directed to the device 100 at an angle to implant region 114 of the P-type active region and form an N-type dopant. The feature 120 masks a shadow portion 130 of the P-type active region 104 to offset the N-type region 114 from the feature 120. The amount of offset of the N-type region 114 is determined by the height of the feature 120 and the angle of the ion implant. Resist portions 140 and 142 mask portions of the active region 104 on opposite sides of the word line 120, with the height (h) of the resist portions selected to mask the P-type region. For instance, further N-type doped regions can be defined in the P-type region using the resist mask with the angled implant, as further discussed in connection with the figures below.

The angled implant and masking techniques described above have also been found to be useful for circuits including thyristors, such as switching circuits and memory circuits. In one example approach involving a circuit having a thin capacitively-coupled thyristor with a control port over a substrate, the control port is used as a mask during the ion implantation of a self-aligned thyristor body region. For instance, in a thyristor having a P-base region under the control port, an N-base region is implanted in the substrate and adjacent to the P-base region using an angled implant over the control port to space a p-n junction between the regions away from the control port. With this approach, the length of the control port and the angled implant are used to determine the width of the P-base region (as related to the junction with the N-base region). Therefore, variation in the width of the P-base region is directly related to variation in the length of the control port (and to the length of any sidewall spacer formed alongside the control port). As discussed above, this approach also does not necessarily include increasing the size of a sidewall spacer alongside the control port or forming a photoresist mask; thus, variations in the width of the N-base region that can sometimes be attributed to spacer and/or photoresist are reduced or even eliminated. In one particular implementation, the N-base region is offset from the control port such that capacitive coupling between the control port and the N-base is reduced.

Figure 2:
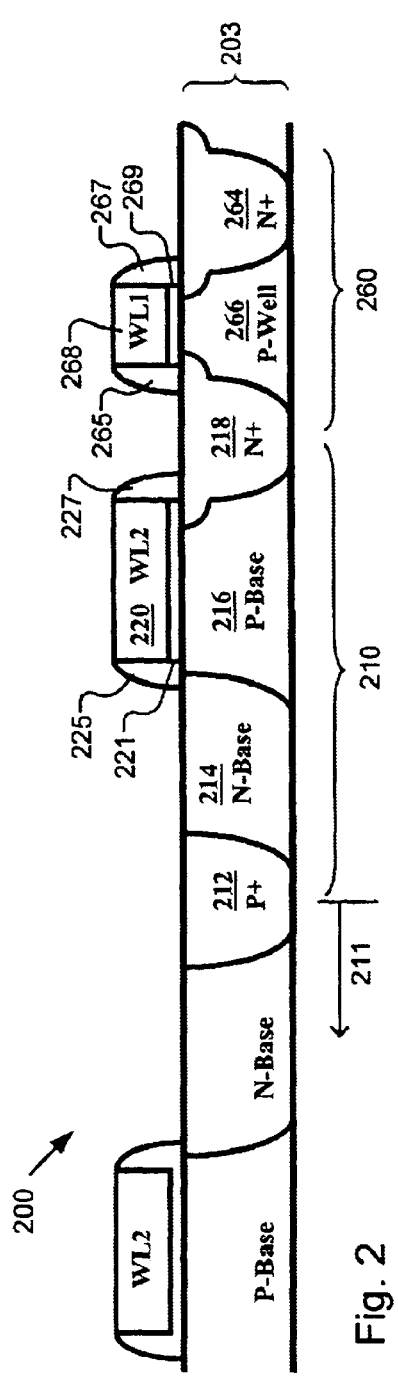
FIG. 2 is a semiconductor device at an early stage of manufacture for implantation using ion implant shadowing, according to another example embodiment of the present invention.
Figure 3:
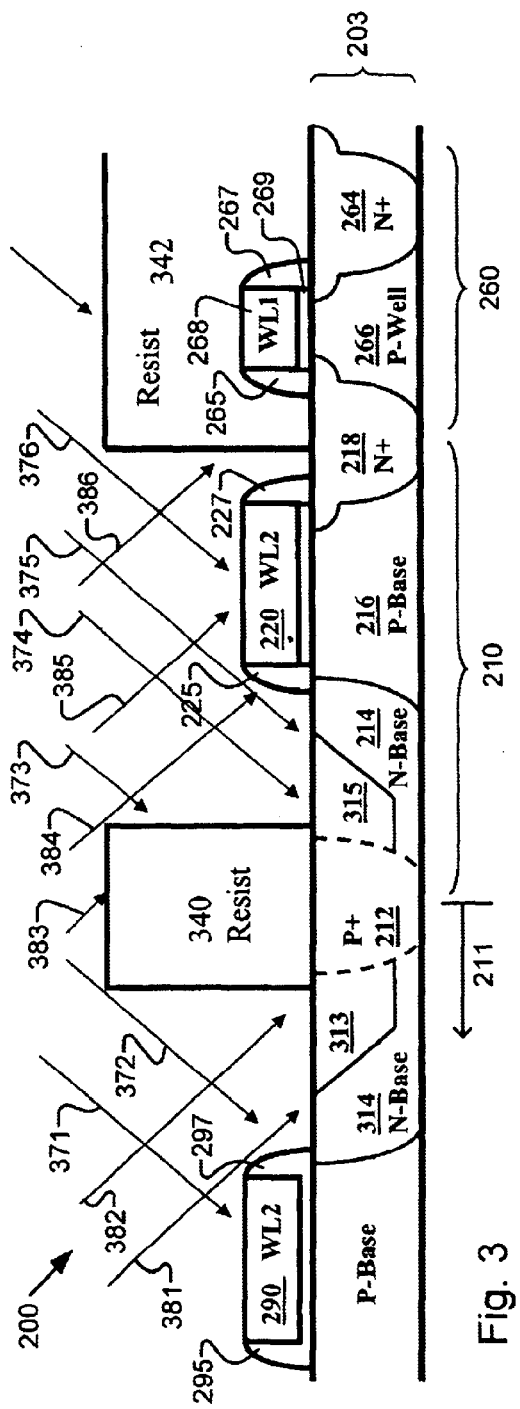
FIG. 3 is the semiconductor device of FIG. 2 undergoing implantation using ion implant shadowing, according to another example embodiment of the present invention.

FIGS. 2 and 3 show a thyristor-based semiconductor device 200 at different stages of manufacture, according to another example embodiment of the present invention. Referring to FIG. 2, the device 200 includes a thyristor 210 electrically coupled to a pass device 260. For the sake of brevity, discussion of mirrored portion 211 of the device 200 is omitted. The thyristor 210 includes a control port 220 over a dielectric material 221 and having sidewall spacers 225 and 227. Body regions of the thyristor 210 are formed in a P-doped region of the substrate 203, for example, using ion implantation with a mask to form N-base region 214, the N-base is implanted at a low angle such as 0° to minimize distance N-base goes under the sidewall spacer, N+ emitter region 218 and P+ emitter region 212. A portion of the P-doped region of the substrate 203 that is masked by the control port 220 and sidewall spacers 225 and 227 forms a P-base region 216 bordered on opposite sides by the N-base region 214 and the N+ emitter region 218. Other mask steps are also performed (e.g., using photoresist) for implanting the P+ emitter region 212, N-base region 214 and N+ emitter region 218.

In one implementation, the distance that the N-base region 214 is separated from the control port 220 is selected such that voltage pulses applied to the control port 220 capacitively couple primarily to the P-base region 216. For instance, when voltage pulses are applied to the control port 220 for controlling the conductance state of the thyristor 210, the capacitive coupling of the pulses is primarily (e.g., generally limited to) the P-base region 216, with any capacitive coupling to the N-base region 114 being substantially small.

The pass device 260 includes a gate electrode 268 disposed over a gate dielectric material 269 on the substrate 203 over a buried oxide layer (not shown), with sidewall spacers 265 and 267 on opposite sides of the gate electrode 268. N+ source/drain regions 218 and 264 are disposed in the substrate 203 and separated by a P-well region 266, with N+ source/drain region 218 also shared with the thyristor 210 as N+ emitter region 218. The N+ source/drain regions 218 and 264 are formed using the gate 268 and spacers 265 and 267 as a mask (with N+ source/drain region 218 also formed using the control port 220 and sidewall spacers 225 and 227 as a mask).

FIG. 3 shows the thyristor-based semiconductor device 200 of FIG. 2 at a later stage of manufacture and undergoing an angled ion implant process. Photoresist mask portions 340 and 342 are patterned over the substrate 203 at a height selected for shadow-masking the substrate 203 when used with the angled ion implant process. In this example, the resist portions 340 and 342 are higher than the control port 220, a mirrored control port 290 and the gate electrode 268 to achieve relatively wide shadow-masking of the substrate 203. The angled ion implant, as shown by arrows 371–376 (implanted at a negative angle relative to an upper surface of the substrate 203) and arrows 381–386 (implanted at a positive angle relative to an upper surface of the substrate 203) forms portions 313 and 315 of the substrate. The spacer 225 on control port 220 and/or the spacer 297 on control port 290 are formed after the angled ion implant. Optionally, the spacers are formed prior to the angled ion implant, which results in a wider shadow mask with a correspondingly wider upper portion of the N-base regions 214 and 314 (e.g., as discussed in connection with FIG. 4 below). These approaches result in an anode emitter region having P+ emitter region 212, implanted as shown in FIG. 2, with additional P+ emitter portions 313 and 315 formed using the angled ion implant process shown in FIG. 3.

Various ones of the example embodiments described below in connection with the figures share similar features with each other and with FIGS. 1–3. In connection with each of these figures, certain discussion of similar features that are similarly numbered has been omitted for brevity.

Figure 4:
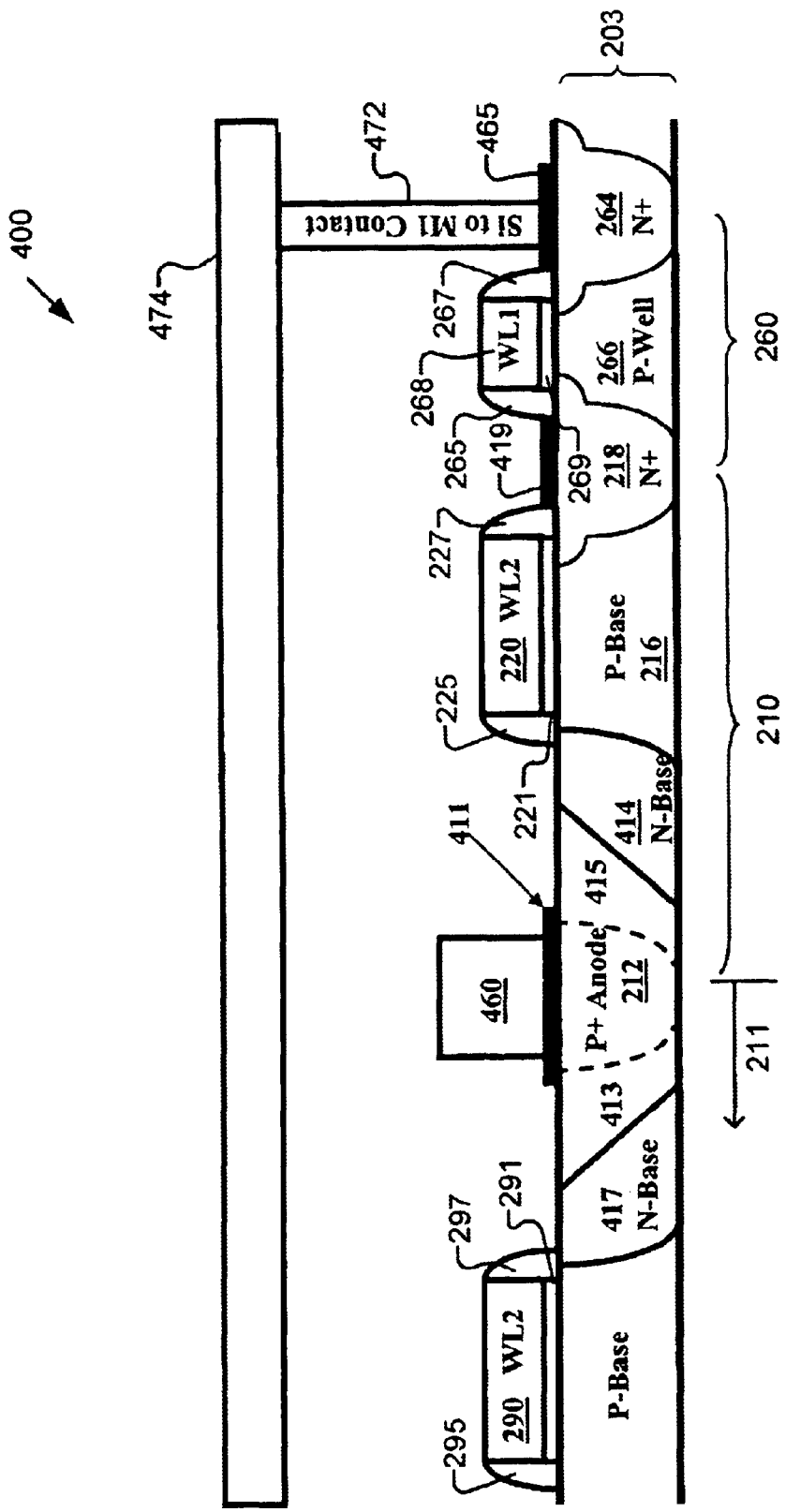
FIG. 4 is a semiconductor device with an N-base region having been implanted after WL2 spacer formation, undergoing ion implantation using ion implant shadowing, according to another example embodiment of the present invention.

FIG. 4 shows a thyristor-based semiconductor device 400 having undergone an angled ion implant, according to another example embodiment of the present invention. In this example, relatively narrow P+ emitter portions 413 and 415 are formed using an angled ion implant after the formation of sidewall spacers 225 and 297. Accordingly, N-base regions 414 and 417 have a relatively wide upper portion thereof, for example, as compared to the N-base regions 214 and 314 of FIG. 3. In addition, any resist formed over the P+anode region 212 (e.g., resist 340 and 342 in FIG. 3) is shown having been removed, with a salicide contact 411 and a local interconnect 460 formed thereafter. Salicide regions 419 and 465 are formed on the N+ emitter and source/drain regions 218 and 264, with a metal contact 472 electrically coupling the N+ source/drain region 264 to a bit line 474.

Figure 5:
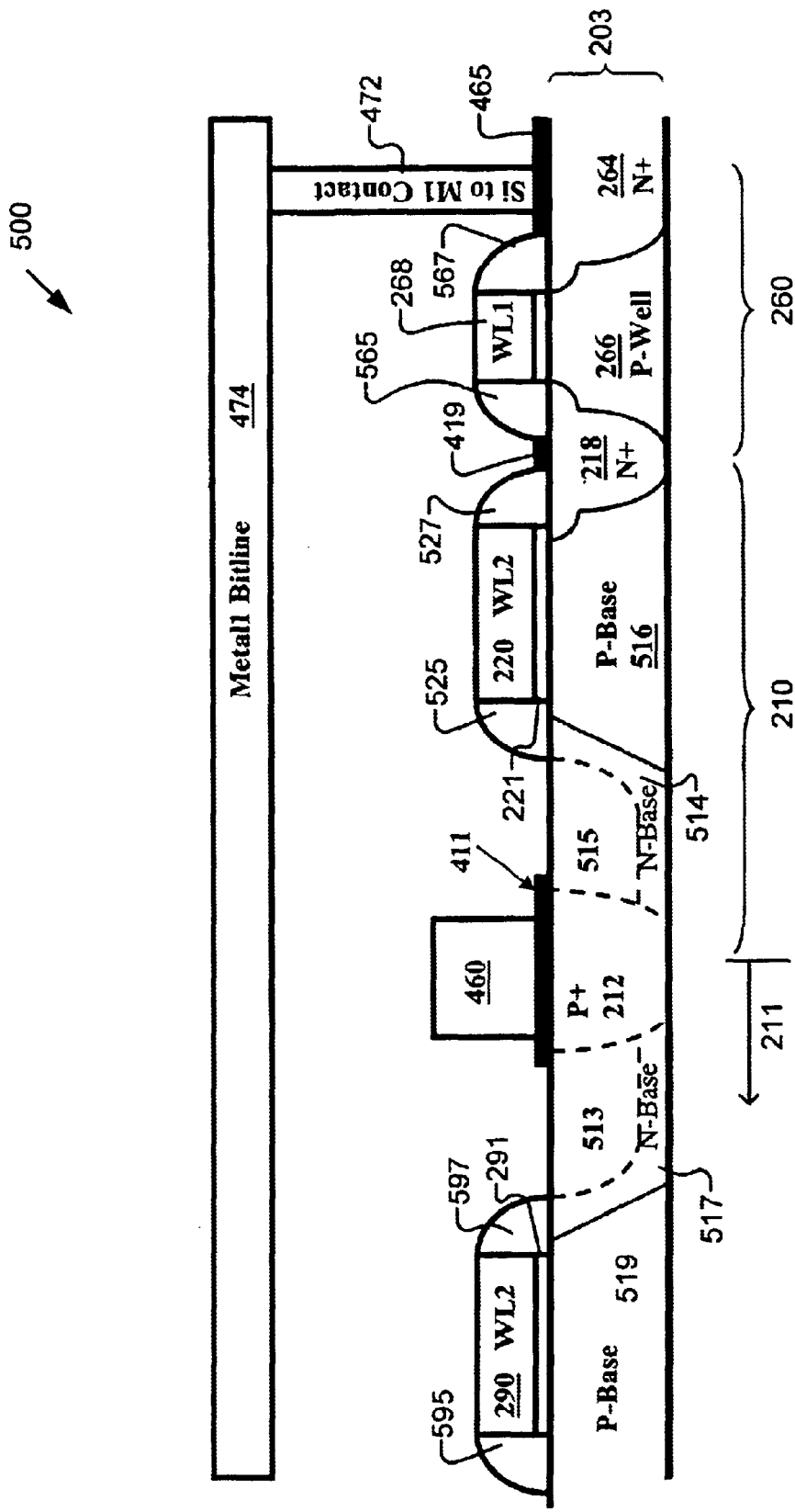
FIG. 5 is a semiconductor device with an N-base region having been implanted in a manner similar to that shown in FIG. 1, but using a wide WL2 spacer and an angled implant to offset the N-base region from WL2, according to another example embodiment of the present invention.

FIG. 5 shows a thyristor-based semiconductor device 500, similar to the device 400 shown in FIG. 4 and utilizing relatively wider sidewall spacers 525, 527, 565, 567, 595 and 591, according to another example embodiment of the present invention. With this approach, the ion implant used to form P+ emitter portions 513 and 515 may be near vertical while maintaining a similar shadowing effect as that used with a relatively thinner spacer and an angled implant, as shown, for example, in FIG. 3. In addition, N-base regions 517 and 514 are formed using an angled ion implant, prior to formation of the spacers 525 and 597, resulting in a substantially linear junction between the N-base regions and their immediately-adjacent P-base regions 516 and 519, respectively.

In another example embodiment of the present invention, an angled ion implant process is used with a mask region to form an extended active region, such as a lightly-doped drain (Ldd) region of a MOSFET. As with the examples discussed above, the height of the mask region (e.g., photoresist and/or features on a substrate surface) affects the width of the angled ion implant, with a portion of the substrate laterally adjacent to the mask region being shadow-masked. This approach is particularly useful for implementations benefiting from both high and low voltage MOSFETs, which are common in integrated circuits having non-volatile memory cells such as FLASH and EPROM memory cells. More specifically, the Ldd region on the drain side of a MOSFET can be controllably increased in width using the shadow-mask process to increase the maximum voltage that the MOSFET can tolerate, for example, without experiencing breakdown.

Figure 6:
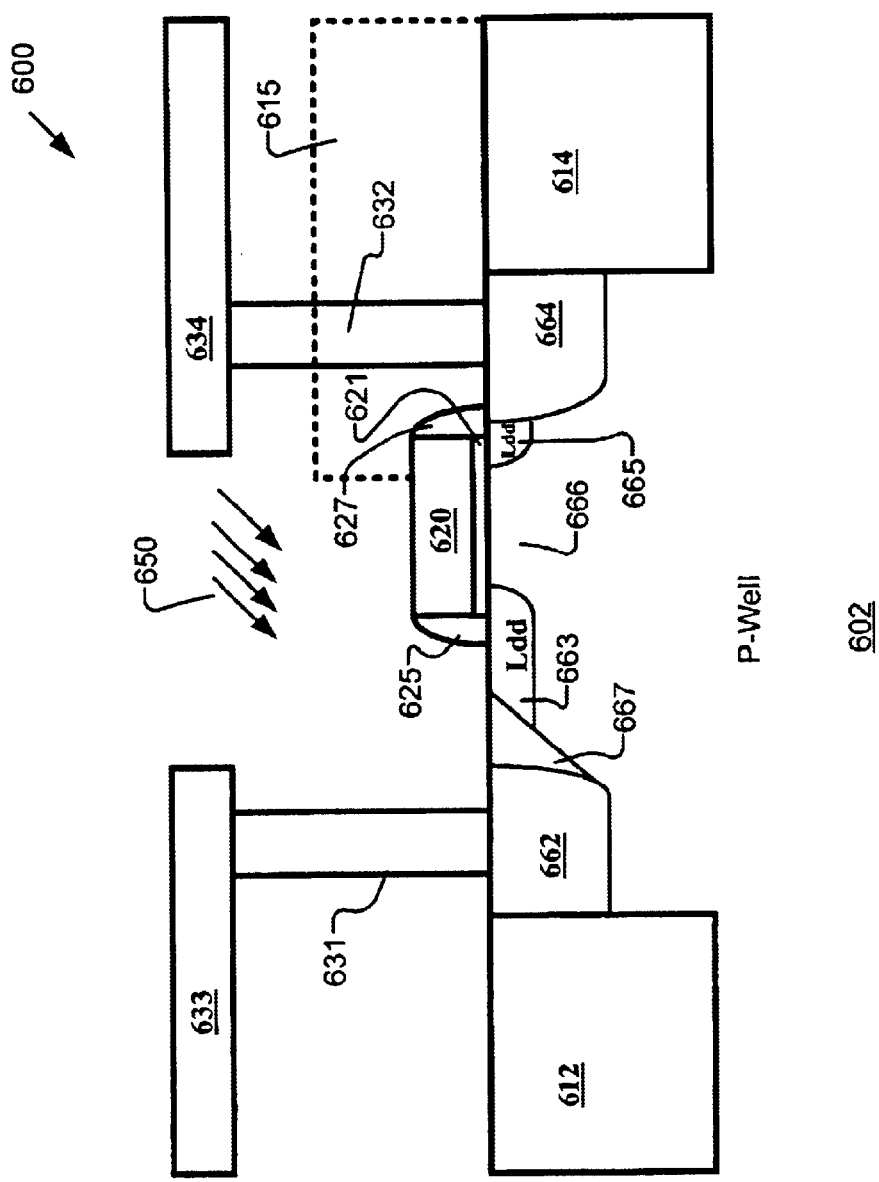
FIG. 6 is an NMOSFET with an extended lightly-doped drain region having undergone angled ion implantation, according to another example embodiment of the resent invention.

FIG. 6 shows a MOSFET device 600 with an extended drain-side lightly-doped drain (Ldd) region 663 formed using ion implant shadowing, according to another example embodiment of the present invention. The device 600 is formed with active regions in a substrate 602 and between isolation regions 612 and 614. A gate stack including a dielectric material 621 and a gate electrode 620 is formed over a channel region 666 of the substrate 602. Using gate electrode 620 as a mask, Ldd regions 663 and 665 are doped in the substrate 602, followed by formation of sidewall spacers 625 and 627. N+ source/drain regions 662 and 664 are disposed adjacent to the isolation regions 612 and 614, using the gate 620 and spacer 627 and a photoresist mask (shown having been removed) to mask the implant thereof. Using another mask 615 (shown by dashed lines) and spacer 625 with an angled ion implant (represented by arrows 650) an angled portion 667 of the substrate 602 is implanted with an N+ dopant, with the resulting Ldd region 663 being relatively wider than Ldd portion 665. Additional circuit connections are then formed, including metal contacts 631 and 632 to metal layers 633 and 634, respectively. With this approach, the breakdown voltage from the drain to the substrate to the source (BVDSS) is increased, which has been found useful in a variety of applications, such as those involving high voltage and/or high temperature.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and doped regions; adding structures to the integrated circuit device; increasing the number of PN body sections in the thyristors; altering the ion implant angles, altering the heights of the mask portions for the ion implant and interchanging P and N regions and/or interchanging PMOSFETS with NMOSFETS. In addition, for general information regarding thyristors including thin capacitively-coupled thyristors and the construction thereof, and for particular information regarding implementations to which the present invention is applicable and their respective operations, reference may be made to U.S. Pat. No. 6,229,161, which is fully incorporated herein by reference. Such modifications and changes do not depart from the true spirit and scope of the present invention that is set forth in the following claims.

What is claimed is:

1. A method for manufacturing a semiconductor device, the method comprising:

forming topological feature over a substrate having an upper surface; and using the features to mask a shadow portion of the substrate that is laterally contiguously adjacent to the feature, directing ions at an acute angle to the upper surface of the substrate and doping a region of the substrate with the ions, the doped region being separated from the features by the masked shadow portion;

wherein forming feature includes forming a thyristor control port and wherein doping a region of the substrate with the ions includes doping a base region of the thyristor adjacent to another base region having a portion thereof in the substrate and below the port;

wherein forming a thyristor includes a thin capacitively-coupled thyristor; and wherein doping the base region includes doping the base region separated from the control port at a distance such that voltage pulses applied to the control port for controlling the conductance state of the thyristor are primarily capacitively coupled to the base region having a portion thereof in the substrate and below the control port.

2. The method of claim 1, further comprising using the feature to mask a second shadow portion of the substrate that is laterally contiguously adjacent to the feature and directing second ions at a second acute angle to the upper surface of the substrate and doping a second region of the substrate with the second ions.

3. The method of claim 2, wherein doping a second region of the substrate includes doping a region of the substrate on the same side of the feature as said doped region.

4. The method of claim 2, wherein doping a second region of the substrate includes doping a region of the substrate on a different side of the feature, relative to said doped region.

* * * * *